United States Patent   (10) Patent No.: US 11,431,149 B1
Morrison et al.                (45) Date of Patent:     Aug. 30, 2022

(54) SINGLE MODE LASER WITH LARGE OPTICAL MODE SIZE

(71) Applicant: Freedom Photonics LLC, Goleta, CA (US)

(72) Inventors: Gordon Barbour Morrison, Summerland, CA (US); Milan L. Mashanovitch, Goleta, CA (US); Hannah Grant, Santa Barbara, CA (US)

(73) Assignee: Freedom Photonics LLC, Goleta, CA (US)

(*) Notice: Subject to any disclaimer, the term of this patent is extended or adjusted under 35 U.S.C. 154(b) by 121 days.

(21) Appl. No.: 16/823,823

(22) Filed: Mar. 19, 2020

Related U.S. Application Data

(60) Provisional application No. 62/822,677, filed on Mar. 22, 2019.

(51) Int. Cl.
*H01S 5/12* (2021.01)
*H01S 5/026* (2006.01)
*G02B 6/14* (2006.01)
*H01S 5/343* (2006.01)

(52) U.S. Cl.
CPC ............. *H01S 5/0268* (2013.01); *G02B 6/14* (2013.01); *H01S 5/1237* (2013.01); *H01S 5/3436* (2013.01); *H01S 5/3438* (2013.01); *H01S 5/34353* (2013.01); *H01S 5/34373* (2013.01)

(58) Field of Classification Search
CPC .. H01S 5/0268; H01S 5/1237; H01S 5/34373; H01S 5/34353; H01S 5/3438; H01S 5/3436; G02B 6/14
See application file for complete search history.

(56) References Cited

U.S. PATENT DOCUMENTS

| 8,401,399 | B2 | 3/2013 | Barton et al. |
| 8,401,405 | B2 | 3/2013 | Barton et al. |
| 8,712,256 | B2 | 4/2014 | Barton et al. |
| 8,718,486 | B2 | 5/2014 | Barton et al. |
| 9,246,596 | B2 | 1/2016 | Barton et al. |
| 9,270,380 | B2 | 2/2016 | Barton et al. |
| 9,344,196 | B1 | 5/2016 | Mashanovitch et al. |
| 9,887,780 | B2 | 2/2018 | Barton et al. |
| 9,941,971 | B1 | 4/2018 | Mashanovitch et al. |
| 10,320,152 | B2 | 6/2019 | Morrison |
| 10,355,451 | B2 | 7/2019 | Morrison et al. |
| 11,152,764 | B1 | 10/2021 | Morrison et al. |
| 2002/0061046 | A1* | 5/2002 | Takiguchi ............... H01S 5/12 372/96 |
| 2005/0230695 | A1 | 10/2005 | Takayama |
| 2006/0093012 | A1 | 5/2006 | Singh et al. |

(Continued)

OTHER PUBLICATIONS

Beck, et al., "Buried Heterostructure Quantum Cascade Lasers with a Large Optical Cavity Waveguide," IEEE Photonics Technology Letters, vol. 12, No. 11, Nov. 2000; 3 pages. pp. 1450-1452.

(Continued)

*Primary Examiner* — Xinning(Tom) Niu
(74) *Attorney, Agent, or Firm* — Knobbe Martens Olson & Bear, LLP

(57) ABSTRACT

A laser including a grating configured to reduce lasing threshold for a selected vertically confined mode as compared to other vertically confined modes.

21 Claims, 14 Drawing Sheets

(56) References Cited

U.S. PATENT DOCUMENTS

| | | |
|---|---|---|
| 2006/0187995 A1 | 8/2006 | Peters et al. |
| 2009/0122824 A1* | 5/2009 | Kawanishi ............... H01S 5/20 372/50.11 |
| 2011/0243175 A1 | 10/2011 | Evans et al. |
| 2014/0363127 A1 | 12/2014 | Baets et al. |
| 2015/0270684 A1 | 9/2015 | Suzuki et al. |
| 2019/0386463 A1 | 12/2019 | Morrison |
| 2020/0183195 A1 | 6/2020 | Morrison |

OTHER PUBLICATIONS

Donnelly, et al., "AlGaAs—InGaAs Slab-Coupled Optical Waveguide Lasers," IEEE Journal of Quantum Electronics, vol. 29, No. 2, Feb. 2003; 10 pages. pp. 289-298.

Juodawlis, et al., "High-Power 1.5-μm InGaAsP—InP Slab-Coupled Optical Waveguide Amplifier," IEEE Photonics Technology Letters, vol. 17, No. 2, Feb. 2005; 3 pages. pp. 279-281.

Juodawlkis, et al., "Continuous-wave two-photon absorption in a Watt-class semiconductor optical amplifier," Optics Express, vol. 16, No. 16, Aug. 4, 2008; 10 pages. pp. 12387-12396.

Juodawlkis, et al., "High-Power, Low-Noise 1.5-μm Slab-Coupled Optical Waveguide (SCOW) Emitters: Physics, Devices, and Applications," IEEE Journal of Selected Topics in Quantum Electronics, vol. 17, No. 6, Nov./Dec. 2011; 17 pages. pp. 1698-1714.

Juodawlkis, et al., "High-Power, Low-Noise Slab-Coupled Optical Waveguide (SCOW) Amplifiers and Lasers," Optical Society of America, OFC conference, 2011; 3 pages. No page numbers.

Juodawlkis, et al., "High-Power, Ultralow-Noise Semiconductor External Cavity Lasers Based on Low-Confinement Optical Waveguide Gain Media," Proc. of SPIE, vol. 7616; 10 pages. pp. 76160X-1 to 76160X-9.

Juodawlkis, et al., "Ultralow-Noise Packaged 1.55-μm Semiconductor External-Cavity Laser with 0.37-W Output Power," Optical Society of America CLEO/IQEC conference, 2009; 3 pages. No page numbers.

Juodawlkis, Paul W. and Plant, Jason J., "Gain-Power Trade-Off in Low-Confinement Semiconductor Optical Amplifiers," International Conference on Numerical Simulation of Optoelectronic Devices 2007; 2 pages. pp. 97-98.

Klamkin, et al., "High-Output Saturation Power Variable Confinement Slab-Coupled Optical Waveguide Amplifier," Optical Society of America, OFC conference 2011; 3 pages. No page numbers.

Liang, et al., "High-Efficiency Oxide-Confined Ridge Waveguide Laser with Nearly Symmetric Output Beam," LEOS 2006—19th Annual Meeting of the IEEE Lasers and Electro-Optics Society; 2 pages. pp. 935-936.

Loh, et al., "Noise Figure of Watt-Class Ultralow-Confinement Semiconductor Optical Amplifiers," IEEE Journal of Quantum Electronics, vol. 47, No. 1, Jan. 2011; 10 pages. pp. 56-75.

Loh, et al., "Packaged, High-Power, Narrow-Linewidth Slab-Coupled Optical Waveguide External Cavity Laser (SCOWECL)," IEEE Photonics Technology Letters, vol. 23, No. 14, Jul. 15, 2011; 3 pages. pp. 974-976.

Madison, et al., "Slab-Coupled Optical Waveguide Photodiode," Optical Society of America, CLEO/QELS conference 2008; 2 pages. No page numbers.

Marcatili, E. A. J., "Slab-Coupled Waveguides," The Bell System Technical Journal, vol. 53, No. 4, Apr. 1974; 30 pages. pp. 645-674.

Pietrzak, et al., "Combination of Low-Index Quantum Barrier and Super Large Optical Cavity Designs for Ultranarrow Vertical Far-Fields From High-Power Broad-Area Lasers," IEEE Journal of Selected Topics in Quantum Electronics, vol. 17, No. 6, Nov./Dec. 2011; 8 pages. pp. 1715-1722.

Ru, et al., "Robust slab-coupled buried-rub semiconductor laser with high fibre coupling efficiency," Electronic Letters, Nov. 2004; 2 pages. vol. 40—No. 24. pp. 1538-1539.

Ryvkin, B.S. and Avrutin, E.A., "Effect of carrier loss through waveguide layer recombination of the internal quantum efficiency in large-optical-cavity laser diodes," Journal of Applied Physics 97, 113106, 2005; 6 pages. pp. 113106-1-113106-5.

Walpole, et al., "Slab-Coupled 1.3-μm Semiconductor Laser With Single-Spatial Large-Diameter Mode," IEEE Photonics Technology Letters, vol. 14, No. 6, Jun. 2002; 3 pages. pp. 756-758.

* cited by examiner

SINGLE MODE LASER WITH LARGE OPTICAL MODE SIZE

CLAIM OF PRIORITY

This application claims the benefit of priority to U.S. Provisional Appl. No. 62/822,677 filed Mar. 22, 2019 and incorporated in its entirety by reference herein.

BACKGROUND

Field

This application relates generally to single-mode lasers.

Description of the Related Art

Lasers are widely used in telecommunications, sensing, and test and measurement applications. Many high-power lasers are not single-mode while many single-mode lasers do not provide high optical powers.

SUMMARY

High-power single-mode lasers that are capable of providing high optical power and single mode operation can be useful for many applications. Example embodiments described herein have several features, no single one of which is indispensable or solely responsible for their desirable attributes. Without limiting the scope of the claims, some of the advantageous features will now be summarized.

Certain embodiments provide a laser comprising a waveguide configured to support a vertically confined fundamental optical mode and at least one vertically confined higher order optical mode. The laser further comprises an active region at a first position with respect to the waveguide. The laser further comprises a grating at a second position with respect to the waveguide. The first position of the active region and the second position of the grating are configured to reduce a first lasing threshold for the fundamental optical mode and to increase a second lasing threshold for the at least one higher order optical mode.

Certain embodiments provide a method for designing a laser comprising a waveguide, an active region, and a grating. The method comprises providing a position of the active region and a position of the grating. The method further comprises calculating at least a vertically confined first optical mode and at least one vertically confined second optical mode supported by the waveguide for the position of the active region and the position of the grating. The method further comprises adjusting the positions of the active region and the grating such that a first product of an overlap of the first optical mode with the grating and an overlap of the first optical mode with the active region is greater than a second product of an overlap of the at least one second optical mode with the grating and an overlap of the at least one second optical mode with the active region. The method further comprises re-calculating at least the first optical mode and the at least one second optical mode and determining perturbations of at least the first optical mode and the at least one second optical mode resulting from the adjusted positions of the active region and the grating. The method further comprises calculating a difference between the first product and the second product. The method further comprises adjusting, if the difference is less than a threshold value, the positions of the active region and the grating such that the first product is larger than the second product.

BRIEF DESCRIPTION OF THE DRAWINGS

In the following description of the various embodiments, reference is made to the accompanying drawings which form a part hereof, and which show, by way of illustration, various embodiments described herein. Other embodiments may be utilized and structural changes may be made without departing from the scope of the present invention.

Figure 1:
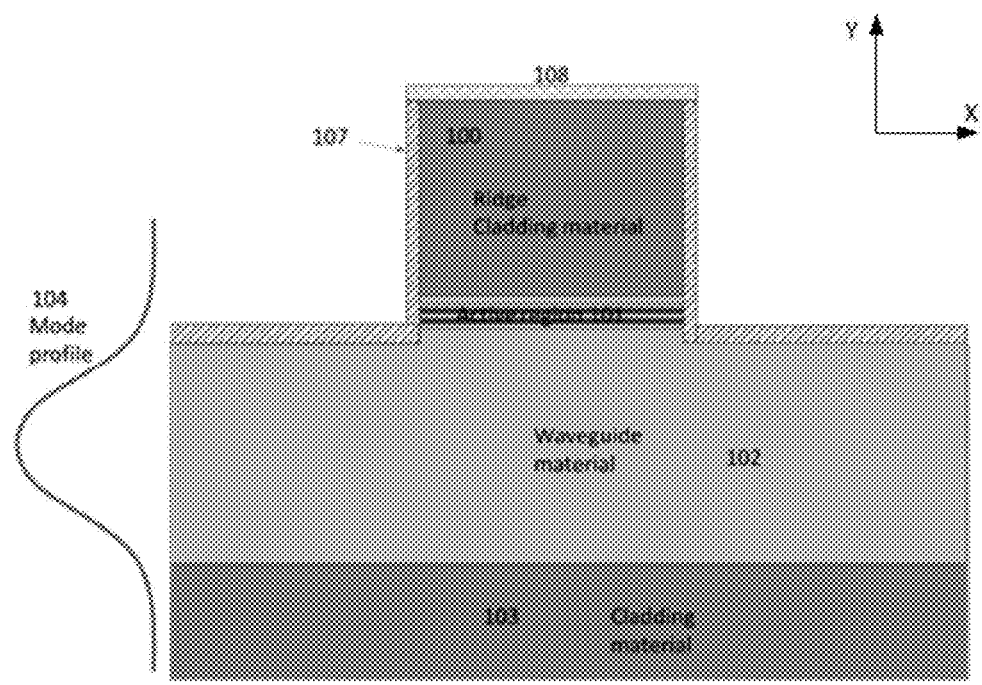
FIG. 1 schematically illustrates an example slab-coupled optical waveguide laser (SCOWL) architecture.

These and other features will now be described with reference to the drawings summarized above. The drawings and the associated descriptions are provided to illustrate embodiments and not to limit the scope of the disclosure or claims. Throughout the drawings, reference numbers may be reused to indicate correspondence between referenced elements.

DETAILED DESCRIPTION

Although certain example embodiments are disclosed below, inventive subject matter extends beyond the specifically disclosed embodiments to other alternative embodiments and/or uses and to modifications and equivalents thereof. Thus, the scope of the claims appended hereto is not limited by any of the particular embodiments described below. For example, in any method or process disclosed herein, the acts or operations of the method or process can be performed in any suitable sequence and are not necessarily limited to any particular disclosed sequence. Various operations may be described as multiple discrete operations in turn, in a manner that may be helpful in understanding certain embodiments; however, the order of description should not be construed to imply that these operations are order dependent. Additionally, the structures, systems, and/or devices described herein can be embodied using a variety of techniques including techniques that may not be described herein but are known to a person having ordinary skill in the art. For purposes of comparing various embodiments, certain aspects and advantages of these embodiments are described. Not necessarily all such aspects or advantages are achieved by any particular embodiment. Thus, for example, various embodiments can be carried out in a manner that achieves or optimizes one advantage or group of advantages as taught herein without necessarily achieving other aspects or advantages as may also be taught or suggested herein. It will be understood that when an element or component is referred to herein as being "connected" or "coupled" to another element, it can be directly connected or coupled to the other element or intervening elements can be present therebetween. For clarity of description, "reflector" or "mirror" can be used interchangeably to refer to an optical element and/or a surface having a reflectivity greater than or equal to about 0.01% and less than or equal to 100%. For example, an optical element and/or a surface having a reflectivity greater than or equal to about 5% and less than or equal to 99%, greater than or equal to about 10% and less than or equal to 90%, greater than or equal to about 15% and less than or equal to 80%, greater than or equal to about 20% and less than or equal to 70%, greater than or equal to about 30% and less than or equal to 60%, or any value in any range/sub-range defined by these values can be considered as a reflector or mirror.

Semiconductor lasers are widely used in many applications ranging from telecommunications to sensing, medical applications, and optical pumping (e.g., pumping other laser mediums or amplifier mediums). Semiconductor lasers can comprise a substrate including an optically active layer thereon. In some implementations, the optically active layer can be configured as an epitaxial layer grown over the substrate using semiconductor growth technology. For many applications, it can be advantageous for these semiconductor lasers to output a single longitudinal mode. One method for achieving single longitudinal mode lasing in III-V semiconductor lasers is by incorporation of a Bragg grating, to create either a Distributed Feed Back (DFB) Semiconductor Laser or a Distributed Bragg Reflector (DBR) Laser. Many embodiments of DBR or DFB laser devices can be configured as edge emitting laser devices that are configured to output light from an edge of the laser device. The plane including the edge can be generally oriented along a direction normal to the substrate of the DBR or DFB laser device. The light output from certain embodiments of the edge emitting DBR and DFB laser devices can be coupled to fibers or other passive waveguide circuits. However, the optical mode output from various embodiments of DFB or DBR lasers can be small and/or asymmetrical and may not be matched with the size and/or shape of optical fibers or waveguides of other passive waveguide circuits into which the light from the DBR or DFB laser device is to be coupled. Accordingly, certain embodiments described herein advantageously provide edge emitting laser devices that are configured to output a single spatial mode having a large size that is matched with the size and/or shape of optical fibers or waveguides of other passive waveguide circuits into which the light from these laser devices is to be coupled.

Certain embodiments described herein provide edge emitting semiconductor laser devices that comprise mode converters that are configured to convert the mode of the light output from the edge emitting semiconductor laser devices to larger and/or a more symmetric shape that can be easily coupled into a glass optical fiber, a plastic optical fibers, a polymer waveguide, a doped glass waveguide, a silicon waveguide, and/or a silicon nitride waveguide. In certain such embodiments, the mode converters can advantageously provide a low loss optical connection between the laser and other optical components.

Without relying on any particular theory, the near field optical mode size, in many implementations of semiconductor lasers comprising a III-V material can be small and elliptical. In many implementations, the full width of the elliptical mode along the minor axis (e.g., the distance along the minor axis between positions at which the intensity is $1/e^2$ of the maximum intensity of the elliptical mode) can be approximately less than or equal to 1 micron and the full width of the elliptical mode along the major axis (e.g., the distance along the major axis between positions at which the intensity is $1/e^2$ of the maximum intensity of the elliptical mode) can be less than or equal to 5 microns. The minor axis of the elliptical mode can be oriented parallel to the crystal growth direction. This type of elliptical mode profile that is compressed along a direction parallel to the crystal growth direction may not be compatible with the size and shape of many implementations of optical fibers and/or doped glass waveguides. For example, many implementations of optical fibers and/or doped glass waveguides can comprise a circular core having a diameter of about 9 microns. Many implementations of $SiN_x$ waveguides can be configured to have an elliptical cross-sectional shape such that an optical mode having an elliptical shape mode can be efficiently in-coupled into the waveguide. However, even in such implementations, the small size of the optical mode can make the optical alignment process difficult as even a small misalignment can increase optical losses.

One approach to increase the size of the optical mode includes providing a symmetric buried heterostructure waveguide with a tapered section which allows a large optical mode to be supported by a small, symmetric buried waveguide. The size of the optical mode is adiabatically enlarged over the length of the taper. However, some optical loss can be incurred as the optical mode propagates through the length of the taper over which the optical mode is adiabatically enlarged. This approach is advantageous to increase the size of optical modes that are symmetric but have a size less than or equal to about one micron. Other approaches to increase the size of an optical mode can include waveguide couplers in which the optical mode from the laser is coupled vertically or laterally to an adjacent passive waveguide that can support an optical mode with a large optical size. However, these approaches can introduce absorption and scattering optical losses as the optical mode propagates through the length of the passive waveguide over which the mode transfer occurs.

Another approach to increase the size of the optical mode output from a semiconductor laser includes using large waveguide cores. However, this approach may not be practical for single mode operation because most conventional laser designs on semiconductor materials (e.g., materials from the III-V group) become multimode when the waveguide thickness is increased such that the core of the waveguide is enlarged. A first implementation of a semiconductor laser capable of outputting a large and symmetric optical mode is a slab-coupled optical waveguide laser (SCOWL), which uses a large weak confinement slab waveguide beneath the active region. The size of the near-field optical mode in such structures can be 2 to 3 microns in diameter, or even larger. FIG. 1 schematically illustrates an example implementation of a SCOWL comprising a cladding region 103 (e.g., substrate), a waveguide layer 102 (e.g., slab waveguide) over the cladding region 103, an active region 101 over and parallel to the waveguide layer 102, and a ridge 100 over the waveguide layer 102. The active region 101 can comprise quantum wells, a bulk material, quantum dots, quantum lines or quantum dashes that provide optical gain to the laser. The active region 101 can have a higher refractive index than the material of the waveguide layer 102 and the material of the ridge 100. In various implementations, the waveguide layer 102 can comprise a quaternary material (e.g., a combination of indium phosphide (InP) and some other material). In various implementations, the ridge 100 can also comprise quantum wells.

In various implementations, the thickness of the waveguide layer 102 can be between about 0.5 micron and about 20 microns. For example, the thickness of the waveguide layer 102 can be greater than 0.5 micron and less than or equal to 2 microns, greater than or equal to 1.5 microns and less than or equal to 5 microns, greater than or equal to 4 microns and less than or equal to 8 microns, greater than or equal to 7.5 microns and less than or equal to 10 microns, greater than or equal to 9.0 microns and less than or equal to 15 microns, greater than or equal to 12.5 microns and less than or equal to 20 microns, or any value in any range and/or sub-range defined by these values.

In various implementations, the cladding region 103 can comprise semiconductor materials such as, for example, InP, AlGaAs, InGaP, or combinations thereof. The waveguide layer 102 can comprise semiconductor materials such as, for example, InGaAsP, AlInGaAs, AlGaAs or combinations thereof. In implementations in which the cladding region 103 and the waveguide layer 102 comprise AlGaAs, the doping concentration of AlGaAs in the waveguide layer 102 can be different from the doping concentration of AlGaAs in the cladding region 103. The ridge 100 can comprise semiconductor materials such as, for example, InP, AlGaAs having a same doping concentration as the AlGaAs of the cladding region 103, InGaP, or combinations thereof.

In various implementations of the SCOWL, as schematically illustrated by FIG. 1, an optional passive layer 107 can be disposed over exposed portions of the surface of the semiconductor laser (e.g., excluding surface portions that are configured to provide electrical contact to the various layers and/or regions of the SCOWL). A conducting material (e.g., a metal) 108 can be disposed on surface portions that are configured to provide electrical contact to the various layers and/or regions of the SCOWL. The profile of the fundamental optical mode 104 of the light output from the SCOWL is shown on the left-side of FIG. 1. The fundamental mode 104 is in the waveguide layer 102 and not localized around the quantum wells of the active region 101. As discussed above, it can be difficult to design the waveguide layer 102 (e.g., having a thickness between 0.5 micron and 20 microns) such that the light output is single mode. Furthermore, it can be difficult to fabricate the thick waveguide layer 102 to have an index of refraction that is less than about 4% of the refractive index of the cladding region 103.

Figure 2:
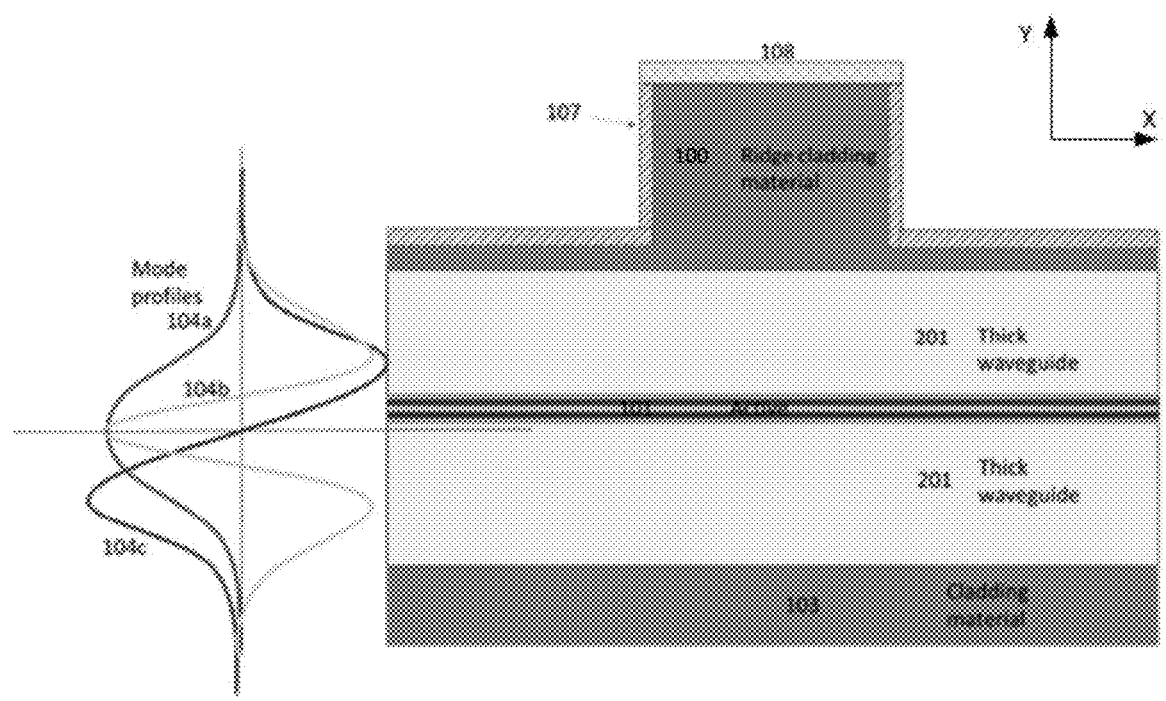
FIG. 2 schematically illustrates an example super-large optical cavity (SLOC) laser architecture.

A second implementation of a semiconductor laser capable of outputting a large and symmetric optical mode is a super-large optical cavity (SLOC) laser, an example of which is schematically illustrated in FIG. 2. Like the SCOWL, a SLOC laser comprises a cladding region 103 (e.g., substrate), a ridge 100, and a waveguide layer 201 between the cladding region 103 and the ridge 100. In the SLOC laser, the active region 101 that provides the optical gain in the laser is positioned within the waveguide layer 201 such that the overlap with the active region 101 of the fundamental mode 104a supported by the waveguide layer 201 is greater than the overlap with the active region 101 of any of the higher order modes supported by the waveguide layer 201 (e.g., second order mode 104b; third order mode 104c). The waveguide layer 201 in various implementations of the SLOC laser can be configured similar to the waveguide layer 102 of the SCOWL described above. For example, the waveguide layer 201 can comprise materials similar to the waveguide layer 102 and/or can have a thickness in a range similar to the thickness range of the waveguide layer 102. The waveguide layers in a SLOC laser or a SCOWL can be configured to output light with circular mode profiles. Accordingly, implementations of the SLOC laser and the SCOWL can advantageously provide optical modes having a size and a shape that are compatible to be in-coupled into optical fibers or other waveguide devices with reduced optical losses as compared to lasers comprising tapered mode converters. Moreover, additional epitaxial growth steps are not required as in buried heterostructure spot-size converters.

Certain embodiments described herein utilize laser designs and/or architectures that comprise a waveguide layer having an enlarged thickness (e.g., similar to the SCOWL and SLOC laser architectures described above) and further comprising a grating (e.g., grating layer; grating structure) in the laser cavity to filter the vertically confined modes of the laser down to fewer vertically confined modes (e.g., to a single vertically confined mode). As used herein, the term "vertically confined mode" has its broadest reasonable meaning, including referring to a mode that is confined in a direction parallel to the growth direction of the semiconductor crystal. Various laser structures described herein can be configured to output light having wavelengths between about 200 nanometers and about 8000 nanometers. Certain embodiments described herein comprise a laser that is grown on a substrate comprising GaAs, InP, silicon, or other crystalline materials. Certain embodiments described herein comprise a cladding region that includes materials such as, for example, InP, AlGaAs, GaAs, AlInGaAs, AlInGaP, InGaAsP, InGaP, InGaAs, InAsP. Similarly, certain embodiments described herein comprise a waveguide layer and an active region that comprise any of the materials described above, as well as others, such as GaN, AlGaN. Certain embodiments described herein comprise a grating layer placed so as to suppress lasing of higher order modes and enhance the lasing of a fundamental mode.

Figure 3:
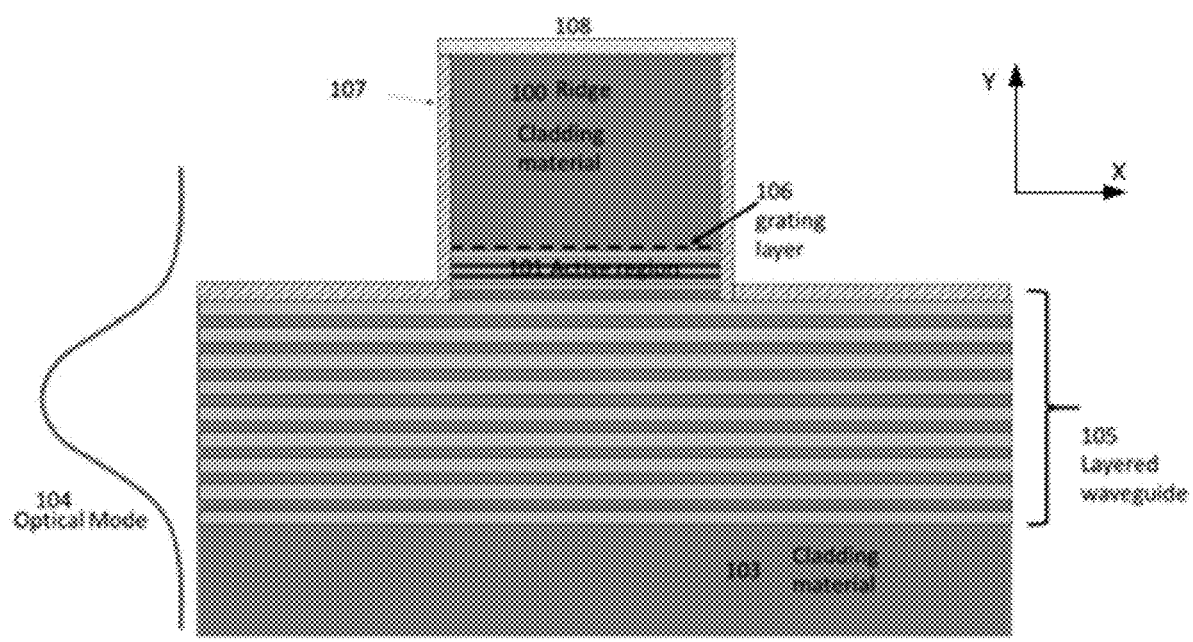
FIG. 3 schematically illustrates an example laser with multilayered waveguide in accordance with certain embodiments described herein.

FIG. 3 schematically illustrates an example laser in accordance with certain embodiments described herein. The laser comprises a region 103 including a cladding material 103, a layered waveguide structure 105, an active region 101 over the layered waveguide structure 105, and a ridge 100 over the layered waveguide structure 105. The layered waveguide structure 105 comprises a plurality of alternating layers comprising a first material and a second material different from the first material. The plurality of layers comprising the first material can be interleaved with the plurality of layers comprising the second material. In certain embodiments, the first material is the material of the cladding region 103 and the second material has a refractive index higher than the refractive index of the first material. In certain embodiments, the difference between the refractive index of the second material and the refractive index of the first material is less than about 0.4%. In certain embodiments, the thickness of the individual layers comprising the first material and the second material depends on the refractive index of the first and the second material. For example, the thickness of an individual layer comprising the second material can be between about 0.01 micron and about 0.5 micron. By tailoring the ratio of thickness of the layers comprising the first material and the layers comprising the second material, the layered waveguide structure 105 can be configured as a weakly confining waveguide. For example, the ratio of the thickness of the layers comprising the first material and the layers comprising the second material can be between about 1:20 and 20:1 to achieve weak confinement in the waveguide. The layered waveguide structure 105 of certain embodiments advantageously has a refractive index substantially close to the refractive index of the material of the cladding region 103, such as, for example less than 4% of the refractive index of the cladding region 103. The total thickness of the layered waveguide structure 105 can be less than about 20 microns in certain embodiments. For example, the total thickness of the layered waveguide structure 105 can be less than or equal to about 2 microns, less than or equal to about 5 microns, less than or equal to about 10 microns, and/or greater than 0.5 micron. The total thickness of the layered waveguide structure 105 can have a value in a range/sub-range defined by any of these values. In certain embodiments, the laser of FIG. 3 has an optical confinement low enough to cut-off all higher order modes except the fundamental spatial mode in the X-Y plane parallel to the cross-section shown in FIG. 3.

In certain embodiments, the laser comprises a grating layer 106 over the active region 101 in the ridge 100, as schematically illustrated by FIG. 3. The grating layer 106 is configured to reduce the number of lasing longitudinal modes. For example, the grating layer 106 can be configured to reduce the number of lasing longitudinal modes to a single longitudinal mode. In certain embodiments, as schematically illustrated in FIG. 3, the waveguide has a layered waveguide structure, while in certain other embodiments, the waveguide has a structure similar to that of the waveguide layer 102 schematically illustrated in FIG. 1.

Figure 4:
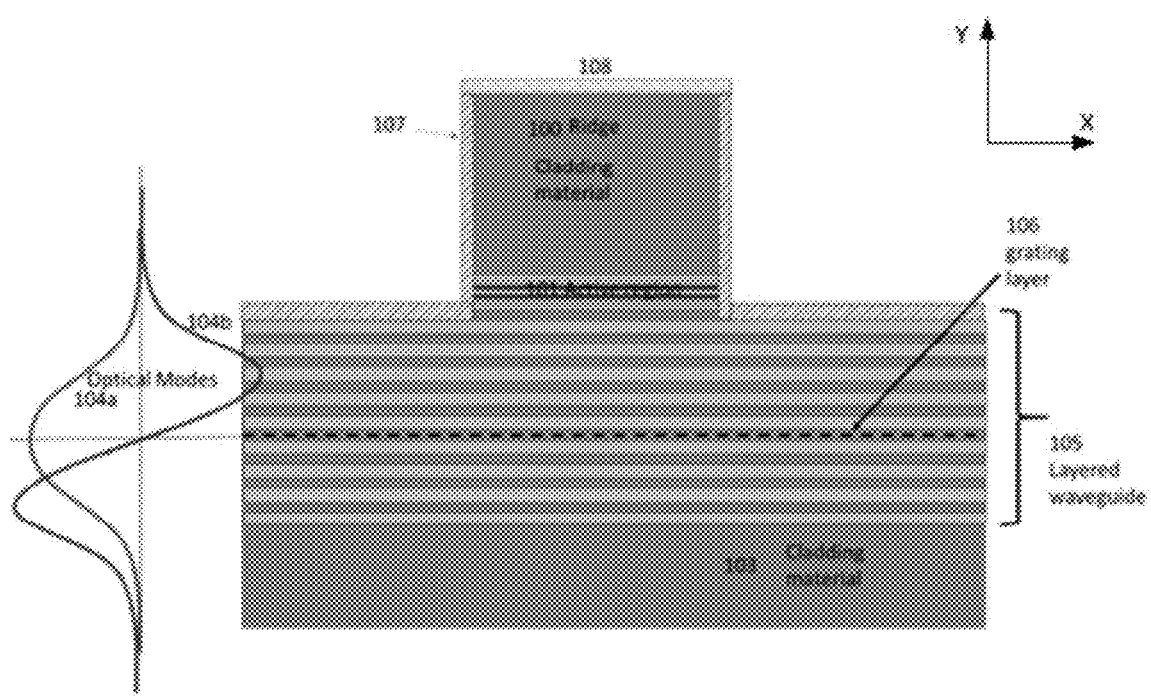
FIG. 4 schematically illustrates an example laser comprising a grating layer in accordance with certain embodiments described herein.

In certain embodiments, the grating layer 106 is in the active region 101 (e.g., within the active quantum well region), while in certain other embodiments, the grating layer 106 is in the layered waveguide 105, as schematically illustrated in FIG. 4. The grating layer 106 can be positioned to interact strongly with the fundamental mode (or the first order mode) and to interact weakly (or not interact at all) with the second order mode. For example, the grating layer 106 can be positioned to coincide with the peak of the fundamental mode 104a and the null of the second order mode 104b. In certain such embodiments, despite the second order mode 104b having comparable or better overlap with the active region 101, only the fundamental mode 104a lases because the feedback from the grating layer 106 for the second order mode 104b (or the coupling between the grating layer 106 and the second order mode 104b) is much lower as compared to the feedback from the grating layer 106 for the fundamental mode 104a (or the coupling between the grating layer 106 and the fundamental mode 104a). In certain such embodiments, the second order mode 104b has a higher lasing threshold as compared to the fundamental mode 104a. For example, in the example laser of FIG. 4, when the fundamental (e.g., first order) mode 104a begins lasing, the carrier threshold is approximately clamped, and additional injection current only serves to enhance the power of the fundamental mode 104a. In certain embodiments, as schematically illustrated in FIG. 4, the waveguide has a layered waveguide structure, while in certain other embodiments, the waveguide has a structure similar to that of the waveguide layer 102 schematically illustrated in FIG. 1.

Figure 5:
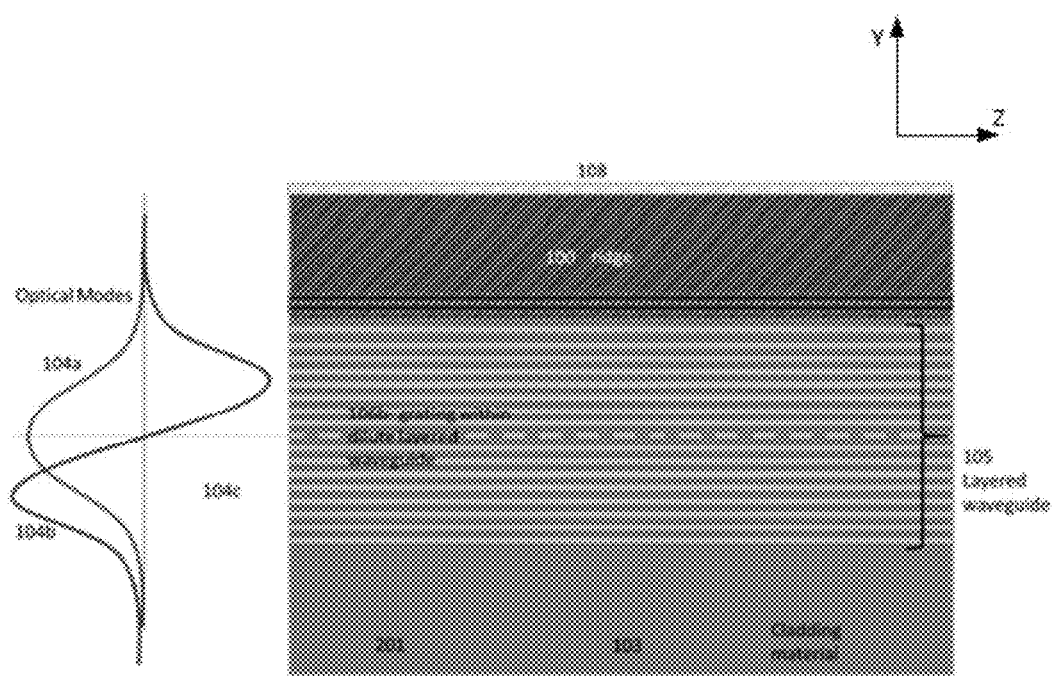
FIG. 5 schematically illustrates a different view of the example laser of FIG. 4.

In certain embodiments, the grating layer 106 comprises a material having higher or lower refractive index as compared to the material of the waveguide 105 or the cladding region 103. In certain embodiments, as schematically illustrated in FIG. 5, the grating layer 106 can be etched in one or more layers of the layered waveguide structure 105. FIG. 5 schematically illustrates a cross-section of the example laser of FIG. 4 in the Y-Z plane with the Z axis oriented along the left to right direction. The ridge etch region 100 is schematically illustrated in FIG. 5 by diagonal line hatching and includes the active region 101. In certain embodiments, as schematically illustrated by FIG. 5, a single layer of the layered waveguide 105 is etched to form the grating 106, while in certain other embodiments, multiple layers of the layered waveguide 105 are etched to form the grating 106. This approach of etching the grating 106 into one or more layers of the layered waveguide 105 can advantageously allow a single calibration of the example laser during fabrication of both the grating 106 and the layers of the layered waveguide 105.

Growing a thick slab waveguide 102 comprising a material that is different from the material of the cladding region 103 over the cladding region 103 can be difficult and can cause defects in the thick slab waveguide 102. In certain embodiments, the layered waveguide 105 (e.g., comprising relatively thinner layers of the waveguide material alternating with thin layers of the cladding material) is simpler to fabricate than a slab waveguide 102. For example, the layered waveguide 105 can comprise relatively thin layers of a waveguide material comprising quaternary or ternary layers or other layers interleaved with relatively thin layers of InP that are grown on a cladding region 103 comprising InP. The grating etch can etch or punch through one or more of the non-InP layers, resulting in a very well controlled coupling coefficient where the thickness of the grating 106 can be controlled only by the thickness of the non-InP layers. Another stack of relatively thin layers of InP interleaved with relatively thin layers of the waveguide material can be further grown over the waveguide layer or layers comprising the grating 106.

Figure 6:
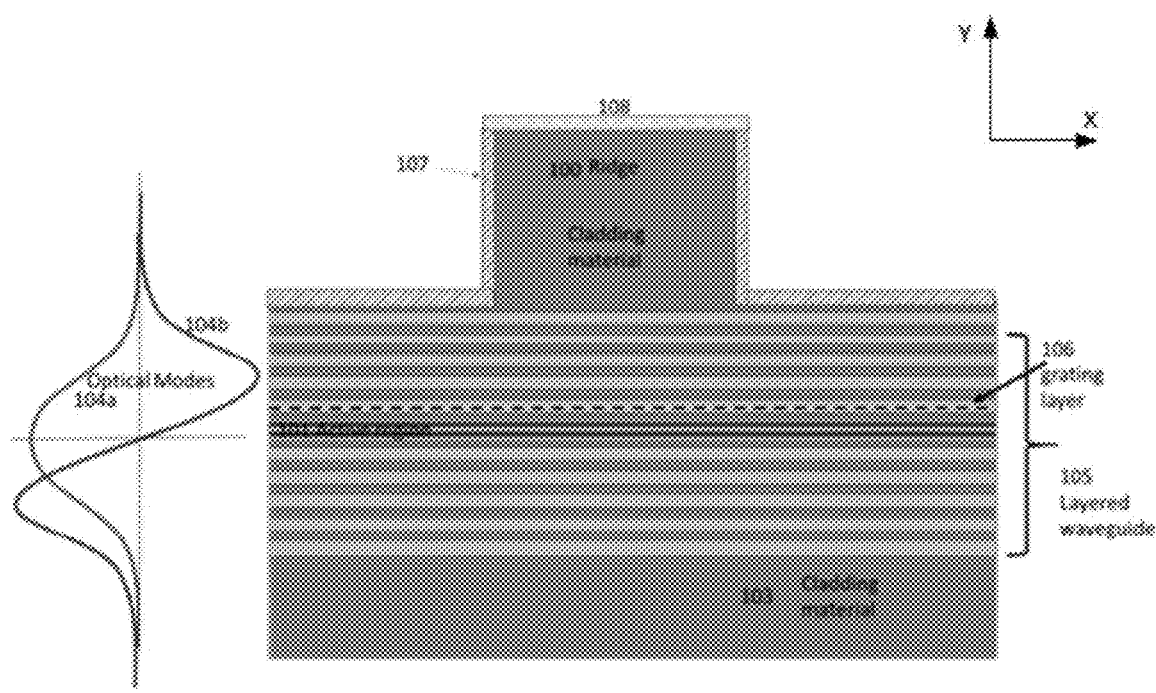
FIG. 6 schematically illustrates a cross-sectional view of an example laser having a layered waveguide structure including a grating and an active region in accordance with certain embodiments described herein.

FIG. 6 schematically illustrates an example laser having a SLOC-like laser structure in accordance with certain embodiments described herein. The example laser comprises a layered waveguide 105 configured to form a weakly confining waveguide and can support two or more guided modes (e.g., by appropriate tailoring of the thickness and refractive index of the various layers of the layered waveguide 105). As in a SLOC laser, the example laser of FIG. 6 comprises an active region 101 comprising one or more quantum wells configured (e.g., positioned within the layered waveguide 105) to have a first overlap with the fundamental optical mode 104a and a second overlap with a higher order mode (e.g., second order mode 104b), the second overlap less than the first overlap. The example laser of FIG. 6 further comprises a grating layer 106 near the active region 101 and positioned within the layered waveguide 105. In certain embodiments, the grating layer 106 is configured to provide overlap with the fundamental mode 104a to a larger extent as compared to the higher order mode (e.g., the second order mode 104b), thereby achieving both higher gain and higher feedback for the fundamental mode 104a compared to the higher order mode (e.g., second order mode 104b) which will result in a much lower threshold gain for the fundamental mode 104a compared to the higher order mode (e.g., second order mode 104b). In certain other embodiments, the grating layer 106 is positioned elsewhere in the example laser structure, because the second order mode 104b can experience virtually no gain and will not lase even if the second order mode 104b experiences a somewhat higher coupling coefficient than does the fundamental mode 104a.

Figure 7:
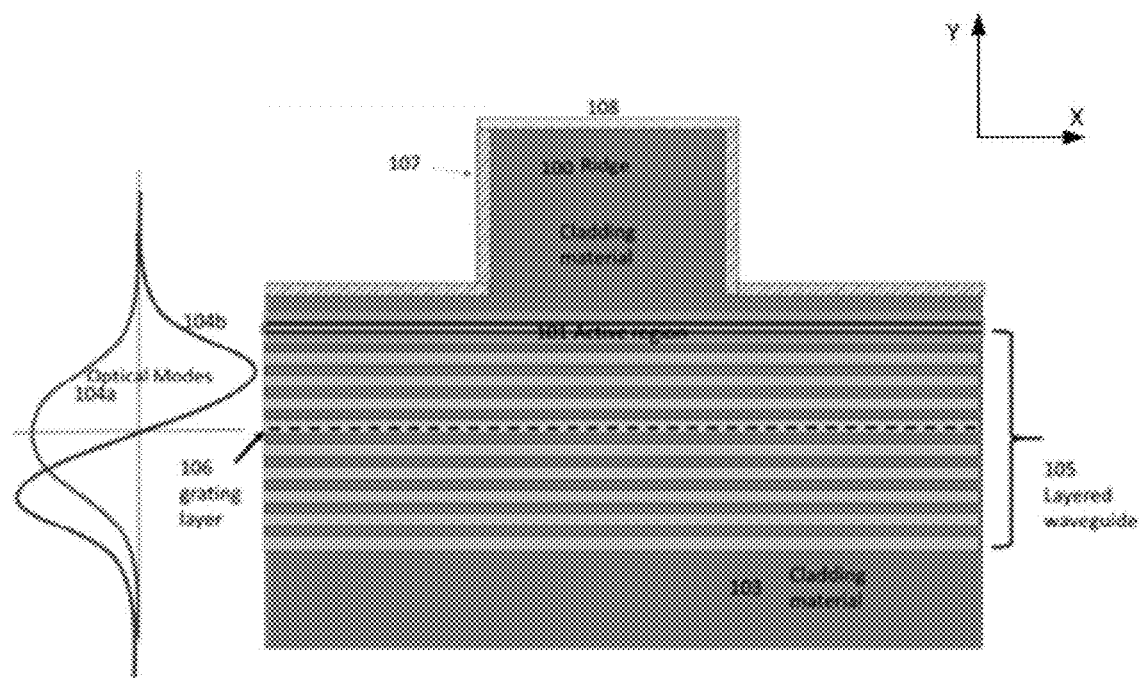
FIG. 7 schematically illustrates a cross-sectional view of an example laser having a layered waveguide structure including a grating configured to limit the number of modes supported in accordance with certain embodiments described herein.

In certain embodiments, for lower confinement within the quantum wells and/or placement of the quantum wells closer to one side of the waveguide (e.g., at the top near a p-doped side of the waveguide in a laser grown with n-doping on the bottom), the grating layer 106 is positioned at or near a null or minimum of the second order mode 104b, as schematically illustrated in FIG. 7. In certain embodiments, the second order mode 104b can experience slightly more gain than does the fundamental optical mode 104a, and the grating layer 106 is configured to interact only with the fundamental mode 104a such that only the fundamental mode 104a lases. The example laser in FIG. 7 can have a lower quantum well overlap with the lasing mode and thus can be conducive to higher power distributed feedback (DFB) laser designs. In certain embodiments, hole injection to the quantum well and electron confinement in the quantum well can result in better performance with the quantum well or other gain medium near the p-cladding. In certain such embodiments, the grating layer 106 selectively lowers the threshold of the fundamental mode 104a, despite the placement of the gain nearer to the most concentration of light in the higher order cavity mode (e.g., the second order mode 104b). In certain embodiments, the active region 101 and the grating layer 106 are configured (e.g., positioned) to select only the second order mode 104b. In certain embodiments, the active region 101 and the grating layer 106 are configured (e.g., positioned) to select two modes (e.g., fundamental mode 104a and the second order mode 104b).

Figure 8:
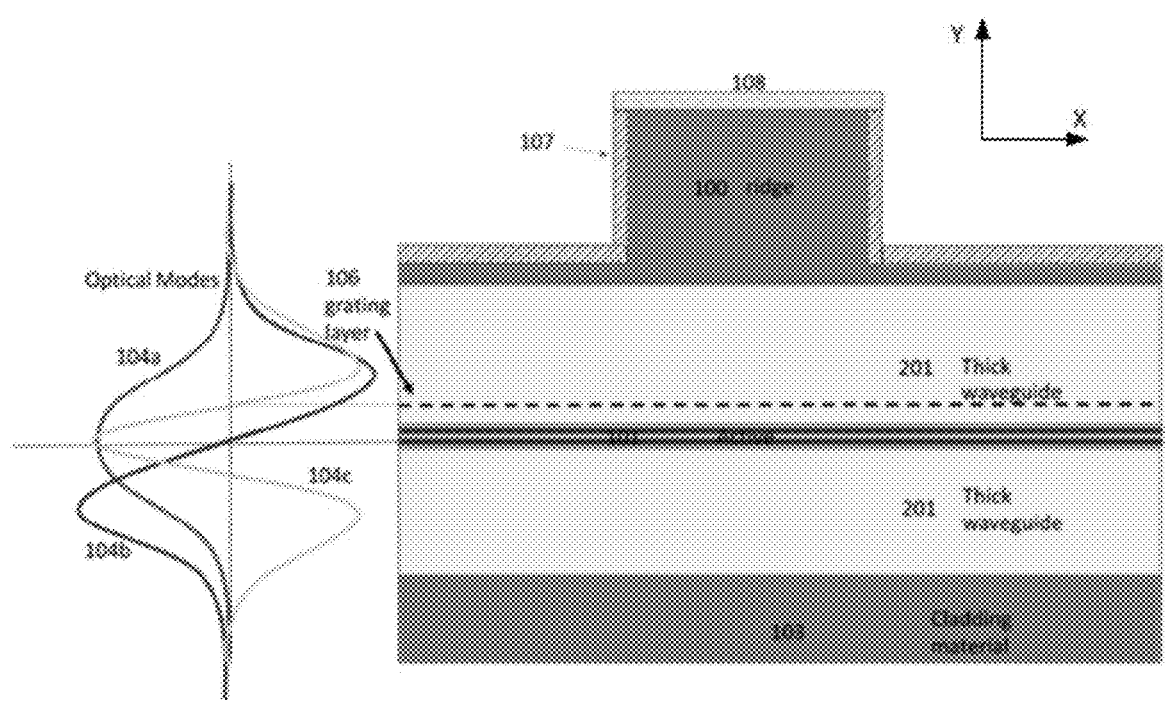
FIG. 8 schematically illustrates a cross-sectional view of an example laser with a large optical cavity that is configured to support multiple modes in accordance with certain embodiments described herein.

In certain embodiments, the grating 106 in a SLOC-like laser architecture provides an additional parameter to suppress higher order modes to ensure single mode lasing. For example, the active region 101 (e.g., comprising quantum wells) can be placed such that the fundamental mode 104a experiences higher gain than do other higher order optical modes (e.g., the second order mode 104b). Tailoring the placement of the grating layer 106 can provide an additional mode selection method to preferentially select the fundamental mode 104a (or, similarly, to deselect other higher order modes). FIG. 8 schematically illustrates an example laser comprising both an active region 101 and a grating layer 106 within a large optical cavity that is configured to support multiple modes in accordance with certain embodiments described herein. The example laser of FIG. 8 uses both the placement of the active region 101 and the placement of the grating layer 106 to select only the fundamental mode 104a. For example, the active region 101 of FIG. 8 is positioned within the thick waveguide 201 such that the active region 101 coincides with a null or a minimum of the second order mode 104b, and the grating layer 106 is positioned within the thick waveguide 201 such that the grating layer 106 coincides with a null or a minimum of the third order mode 104c. In certain embodiments, the thickness of the waveguide 201 is between about 0.5 micron to 20 microns (e.g., depending on the wavelength of light that the example laser is designed to emit).

Figure 9:
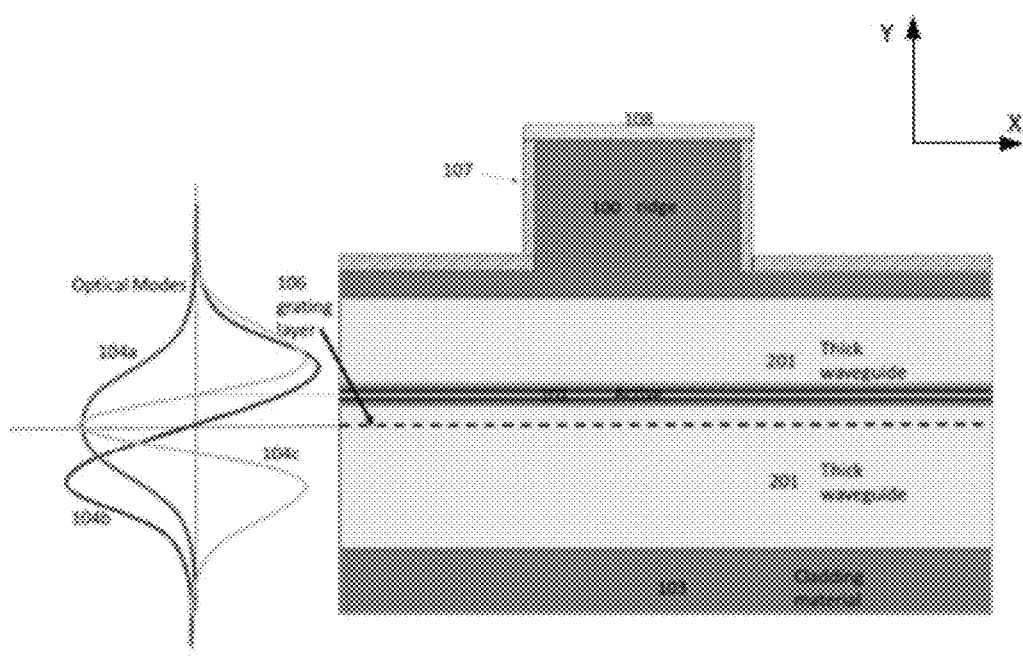
FIG. 9 schematically illustrates a cross-sectional view of an example laser with a large optical cavity that is configured to support a single mode in accordance with certain embodiments described herein.
Figure 10:
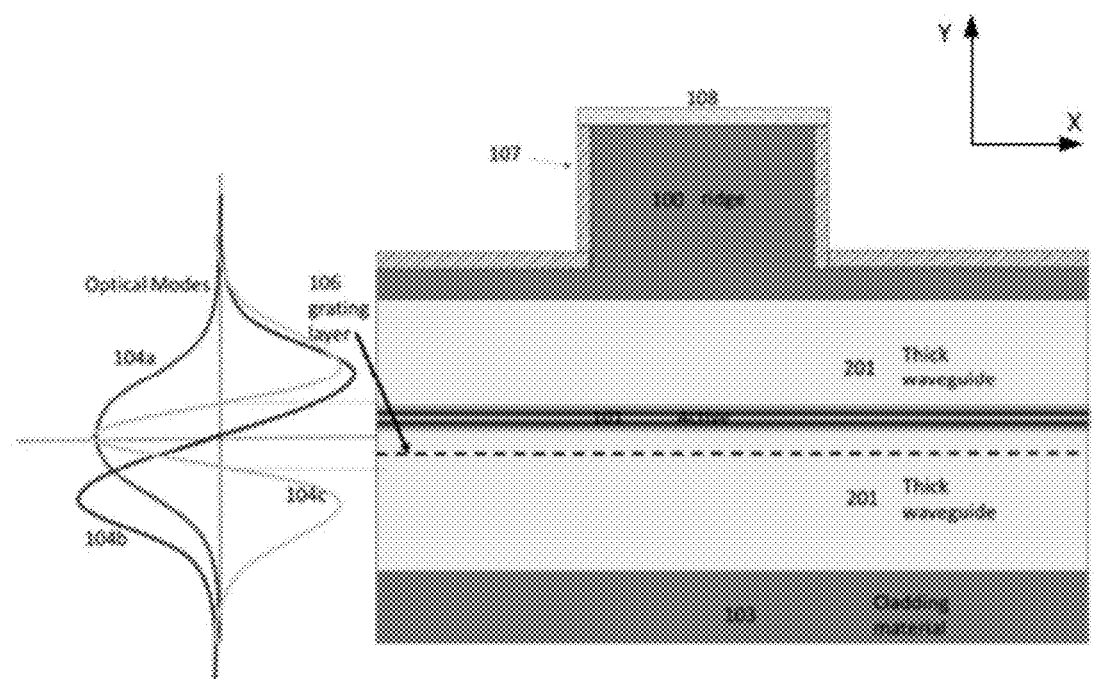
FIG. 10 schematically illustrates a cross-sectional view of another example laser with a large optical cavity that is configured to support a single mode in accordance with certain embodiments described herein.

In certain embodiments, the active region 101 and/or the grating layer 106 is configured (e.g., positioned) to suppress lasing of one or more modes (e.g., all but the fundamental mode 104a or some selected higher order mode). For example, as shown in FIG. 9, the grating layer 106 can be positioned within the thick waveguide 201 to coincide with a null or a minimum of the second order mode 104b so as to suppress the second order mode 104b, and the active region 101 can be positioned within the thick waveguide 201 to coincide with a null or a minimum of the third order mode 104c so as to suppress the third order mode 104c. FIG. 10 schematically illustrates another example laser in which the active region 101 and the grating layer 106 are both positioned in regions of the thick waveguide 201 that are equally unfavorable to the second order mode 104b and the third order mode 104c, while being favorable to the fundamental mode 104a (e.g., coincide with or overlap with the peak of the fundamental mode 104a). In certain embodiments, the thick waveguide 201 can comprise a slab of a material such as, for example, InGaAsP or AlInAs. In certain embodiments, the waveguide 201 can be a layered waveguide comprising alternate layers of a first material and a second material, as discussed above in connection with FIGS. 3, 4 and 6.

Figure 11:
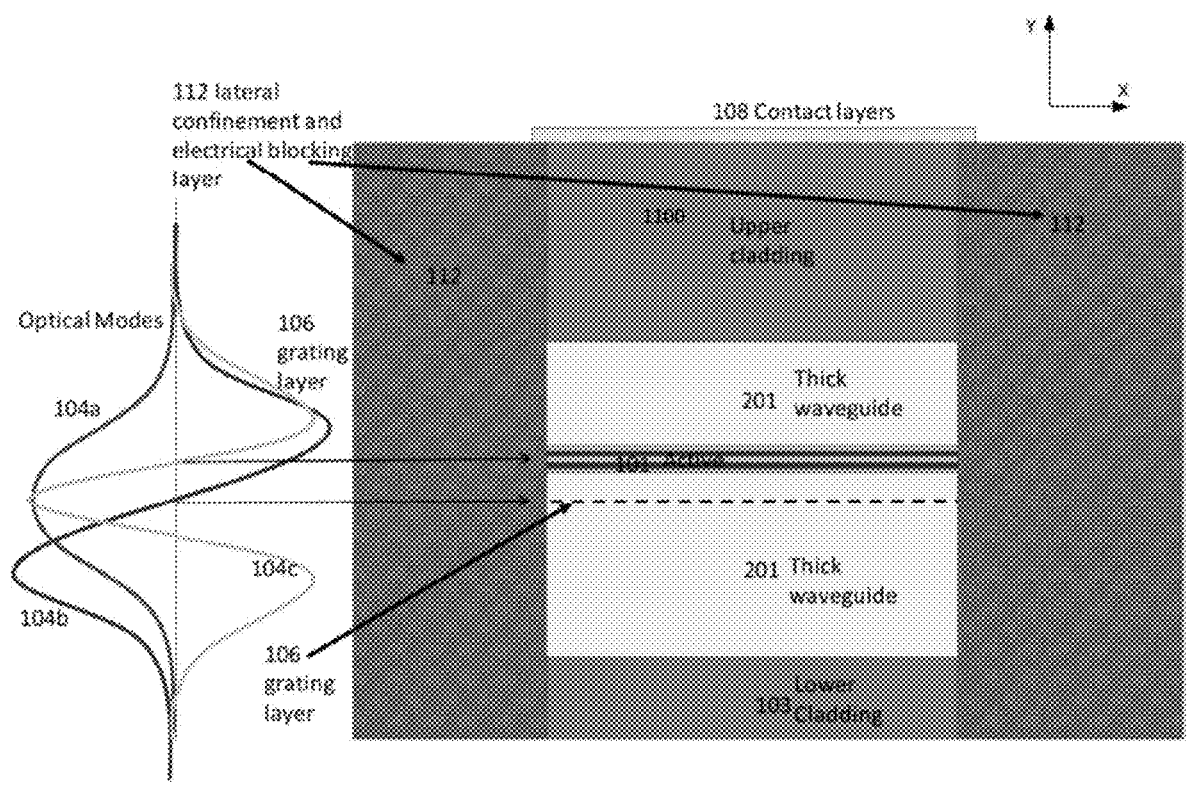
FIG. 11 schematically illustrates a cross-sectional view of an example laser with a buried waveguide architecture and a large optical cavity that is configured to support a single mode in accordance with certain embodiments described herein.

The method of designing and/or fabricating a laser by positioning the active region 101 and/or the grating layer 106 to selectively reduce the number of spatial modes supported by the waveguide is not limited to ridge waveguide architectures (e.g., schematically illustrated in FIGS. 3-10), but are also applicable to a wide variety of waveguide designs and architectures, including but not limited to a buried waveguide architecture. FIG. 11 schematically illustrates an example laser comprising a buried waveguide 201 that is confined vertically (e.g., in a direction along the growth direction) between the cladding region 103 (e.g., a lower cladding region) and another cladding region 1100 (e.g., an upper cladding region) and confined laterally by regions 112 comprising a material having a refractive index substantially equal to that of the material of the cladding region 103. In certain embodiments, the cladding region 1100 comprises the same material as does the cladding region 103 and/or the cladding region 1100 comprises a material having a refractive index substantially equal to that of the material of the cladding region 103. In certain embodiments, the cladding region 1100 and the regions 112 comprise the same material as does the cladding region 103. In certain embodiments, the material of the regions 112 can also be electrically blocking (e.g., similar to existing buried heterostructure waveguide architectures). The thick waveguide 201 can comprise a bulk material, as discussed above, or can comprise a layered structure (e.g., similar to the layered waveguide 105 discussed above). In certain embodiments, as schematically illustrated in FIG. 11, the grating layer 106 and the active region 101 are configured (e.g., positioned) to inhibit or prevent lasing of the vertically confined second order mode 104b and the vertically confined third order mode 104c (e.g., similar to the example laser schematically illustrated in FIG. 9). In certain embodiments not having a ridge (e.g., broad area structures), the grating layer 106 and the active region 101 are configured such that higher order modes in the vertical direction are suppressed.

As described herein, designing and/or fabricating the various example lasers comprises the placement of the grating layer 106 and the active region 101. In certain embodiments in which only two vertical modes that are perpendicular to the direction of the material growth are present, the grating layer 106, the active region 101, or both can be positioned at or near a center of the waveguide so as to coincide with a null or a minimum of the second order mode 104b. In certain other embodiments in which three vertical modes are present, the grating layer 106 and/or the active region 101 can be offset from the center of the waveguide so as to coincide with a null or a minimum of two higher order modes (e.g., second order mode 104b; third order mode 104c). During the design phase, the positions of the grating layer 106 and the active region 101 can be calculated using a mathematical model to simulate the modes which are supported by the waveguide, and the positions of the active region 101 and the grating layer 106 can be iteratively changed relative to the peaks and nulls of the fundamental mode 104a and the higher order modes. Without relying on any particular theory, the position of the active region 101 can perturb the mode profile significantly as a result of its thickness and relatively high index of refraction. The grating layer 106, however, provides a small perturbation to the mode profile, and can be moved within the waveguide without significantly altering the nature of the supported modes. In certain embodiments, the iterative process can be advantageous to improve or optimize the position of the active region 101. In certain embodiments, the placement of the grating layer 106 can be calculated initially and does not change much during the iterative process.

Figure 12:
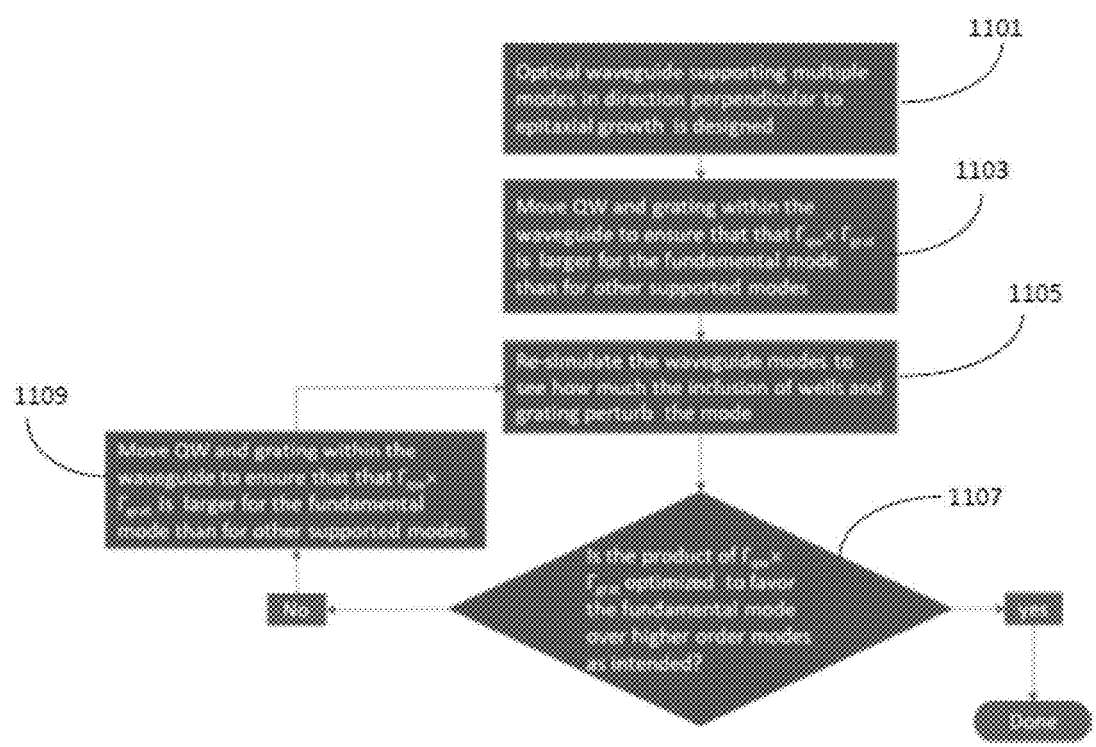
FIG. 12 schematically illustrates a flow chart illustrating an example iterative method for designing a laser with a large optical cavity configured to support a single mode in accordance with certain embodiments described herein.

FIG. 12 is a flow chart that illustrates an example iterative method for designing a laser in accordance with certain embodiments described herein. The method comprises determining the position of the active region 101 and the grating layer 106 to selectively reduce the threshold for lasing of a single vertically-confined mode (e.g., the fundamental mode 104a) while suppressing lasing of other vertically-confined modes (e.g., second order mode 104b; third order mode 104c). For example, the position of the active region 101 and the grating layer 106 can be selected to reduce the lasing threshold for the fundamental mode 104a. In certain embodiments, the iterative method of FIG. 12 increases or maximizes the combined effect of the coupling coefficient of the grating layer 106 (also referred to as grating feedback) proportional to $\Gamma_{grat}$ (e.g., the overlap of an optical mode with the grating layer 106) and gain from the active region 101 proportional to $\Gamma_{qw}$ (e.g., the overlap of the optical mode with the active region 101) for the fundamental mode 104a. In certain embodiments, $\Gamma_{grat}$ and $\Gamma_{qw}$ are calculated for each mode by measuring the portion of the mode that is within the grating layer 106 or the active region 101 of the waveguide. If $\Gamma_{qw}$ and/or $\Gamma_{grat}$ can be kept very low for higher order modes as compared to their values for the fundamental mode 104a, the lasing threshold for the fundamental mode 104a can be much lower as compared to the lasing threshold for other modes and only the single fundamental mode 104a is supported. In certain embodiments, the product $\Gamma_{qw} \times \Gamma_{grat}$ for the fundamental mode 104a can be in a range of about 1-20 dB (e.g., 1 dB, 3 dB, 10 dB, 15 dB, 20 dB or any value in a range/sub-range defined values between 1 dB and 20 dB) greater than the product $\Gamma_{qw} \times \Gamma_{grat}$ for other higher order modes present in the waveguide to selectively reduce the lasing threshold for the fundamental mode 104a.

In an operational block 1101, the example method of FIG. 12 comprises calculating the different modes that are supported by an optical waveguide for an initial position of the active region 101 and the grating layer 106. In an operational block 1103, the example method further comprises moving the positions of the active region 101 (e.g., comprising one or more quantum wells, a bulk material, quantum dots, quantum lines or quantum dashes that provide optical gain to the laser) and the grating layer 106 within the waveguide such that the product $\Gamma_{qw} \times \Gamma_{grat}$ for a desired mode (e.g., fundamental mode 104a) is greater than the product $\Gamma_{qw} \times \Gamma_{grat}$ for one, two, three, four or all other modes supported by the waveguide. In an operational block, 1105, the example method further comprises calculating the different modes supported by the waveguide again to determine the perturbation of the different modes resulting from a change in the position of the active region 101 and the grating layer 106. In an operational block 1107, the example method further comprises calculating a difference between the product $\Gamma_{qw} \times \Gamma_{grat}$ for a desired mode (e.g., fundamental mode 104a) determined in block 1105 and the product $\Gamma_{qw} \times \Gamma_{grat}$ for one, two, three, four or all other modes supported by the waveguide determined in block 1105. In an operational block 1109, the example method further comprises adjusting, if the difference calculated in block 1107 is less than a threshold value (e.g., 1 dB, 3 dB, 10 dB, 15 dB, 20 dB, or any value in a range/sub-range defined by any of these values), the positions of the active region 101 and the grating structure 106 such that the product $\Gamma_{qw} \times \Gamma_{grat}$ for the desired mode (e.g., fundamental mode 104a) is larger than the product $\Gamma_{qw} \times \Gamma_{grat}$ for the one, two, three, four or all other modes supported by the waveguide. If the difference calculated in block 1107 is greater than a threshold value (e.g., 1 dB, 3 dB, 10 dB, 15 dB, 20 dB, or any value in a range/sub-range defined by any of these values), then the positions of the active region 101 and the grating structure 106 can be considered to be optimized.

Figure 13:
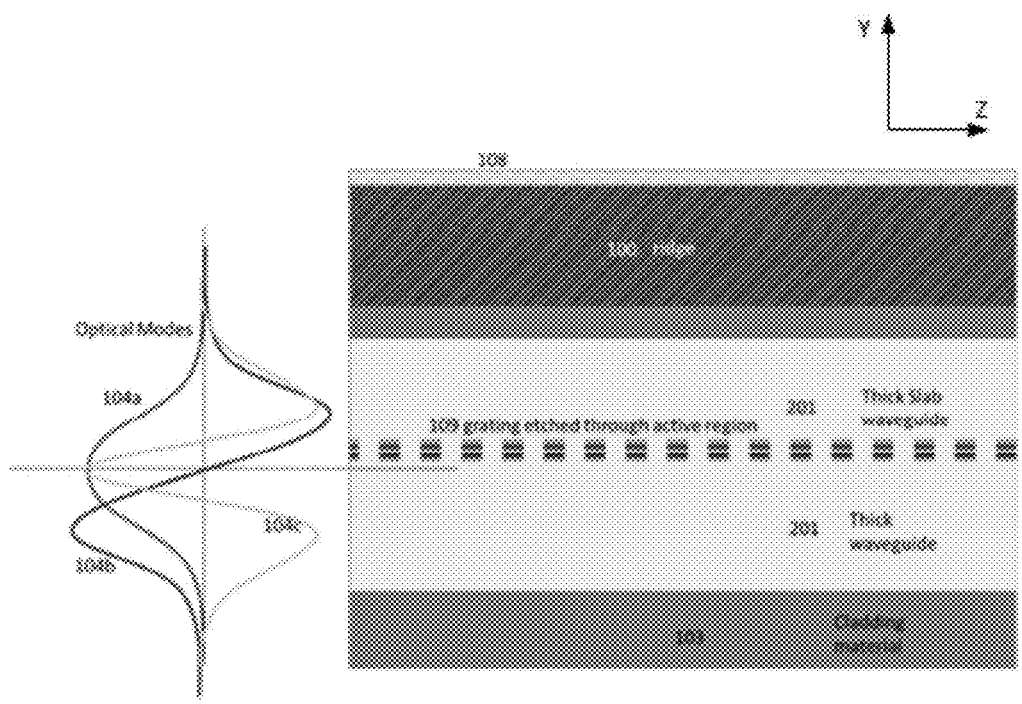
FIG. 13 schematically illustrates a cross-sectional view of an example laser comprising a gain coupled grating configured to provide enhanced gain and feedback to the fundamental mode over other higher order modes in accordance with certain embodiments described herein.

In certain embodiments, as schematically illustrated by FIG. 13, the laser comprises an active region 101 and a grating layer 106 that are combined together (e.g., which can be referred to as a gain-coupled laser). For example, the active region 101 and the grating layer 106 can be combined together by partially or completely etching away the gain region from certain portions of the active region 101. In certain embodiments, as schematically illustrated in FIG. 13, the active region 101 and the grating layer 106 are placed together within the thick waveguide 201 at a position that overlaps with the peak of the fundamental mode 104a and thus selectively reduce the lasing threshold for the fundamental mode 104a and suppresses other higher order modes.

Figure 14:
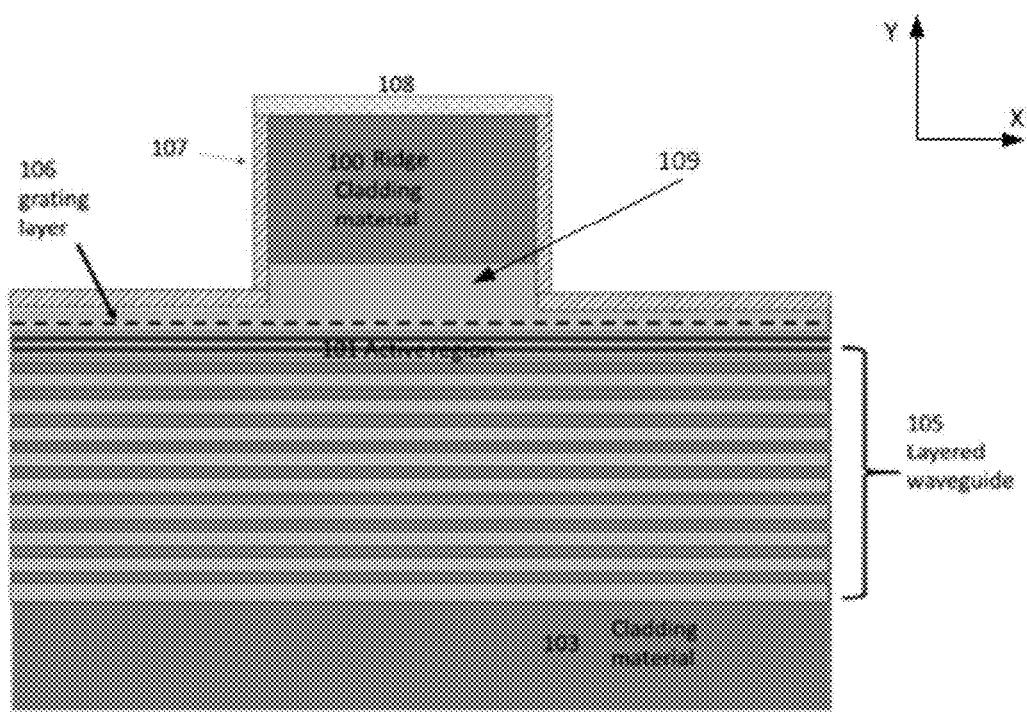
FIG. 14 schematically illustrates an example laser comprising a ridge layer above the active region in accordance with certain embodiments described herein.

In certain embodiments, as schematically illustrated by FIG. 14, a high power single mode laser utilizes a higher index portion of cladding within the ridge 100. This example laser is like a hybrid between the SLOC and SCOWL architectures, with the active region 101 below the ridge 100, and a region 109 comprising a material having a refractive index greater than that of the cladding material of the ridge 100, as schematically illustrated in FIG. 14. This architecture is different from the architecture of the SCOWL in that the active region 101 is below the ridge 100 and is different from the SLOC laser architecture in that the ridge 100 comprises a high refractive index material as well as cladding material. Certain such embodiments have an advantage over the SCOWL architecture in that the active region 101 is not etched through by the ridge 100, leading to easier processing and better reliability. In certain embodiments, the waveguide 105 of the laser schematically illustrated in FIG. 14 is configured to support only a large single optical mode and to not support any higher order modes. In certain embodiments, the waveguide 105 of the laser schematically illustrated in FIG. 14 supports two, three or more modes, and the placement of the grating layer 106 and/or the grating layer 106 is selected (e.g., optimized) to allow lasing of a desired mode. In certain embodiments, the waveguide 105 has a layered waveguide structure, as schematically illustrated in FIG. 14, while in certain other embodiments, the waveguide 105 has a slab waveguide structure comprising a material having a refractive index less than the refractive index of the region 109. In certain embodiments, the grating layer 106 is above or below the active region 101, or within the ridge 100. In certain embodiments, the grating layer 106 is configured (e.g., positioned) to reduce or minimize overlap with higher order modes while increasing or maximizing overlap with the fundamental mode 104*a*, thereby providing for lasing of the fundamental mode 104*a*.

Certain embodiments described herein can be configured to output optical power greater than or equal to about 10 mW (e.g., greater than or equal to about 20 mW, greater than or equal to about 30 mW, greater than or equal to about 50 mW, greater than or equal to about 75 mW, greater than or equal to about 100 mW, greater than or equal to about 150 mW) and/or less than or equal to 50 W (e.g., less than or equal to 25 W, less than or equal to 10 W, less than or equal to 5 W, less than or equal to 1 W), or any optical power in a range/sub-range defined by these values. Certain embodiments described herein are configured to output a single vertically confined mode. Accordingly, the light output from certain embodiments described herein have a large side mode suppression ratio (SMSR). For example, the SMSR of light output from certain embodiments described herein can be between about 10 dB and about 150 dB (e.g., between about 10 dB and about 20 dB, between about 15 dB and about 30 dB, between about 20 dB and about 40 dB, between about 30 dB and about 60 dB, between about 40 dB and about 80 dB, between about 50 dB and about 100 dB, between about 60 dB and about 120 dB, between about 70 dB and about 140 dB, or any value in any range/sub-range defined by these values.).

Although for various embodiments of lasers discussed herein, the active region and/or the grating layer can be described as being positioned at the peak and/or at the null of the vertically confined mode, it should be appreciated that the active region and/or the grating layer can be positioned near or in proximity to the peak and/or near or in proximity to the null of the vertically confined mode to increase/decrease lasing threshold of the vertically confined mode.

In certain embodiments, a computer system is used for some or all of the calculations described herein. For example, the computer system can comprise hardware (e.g., at least one microprocessor) operative to execute software (e.g., code stored on computer-readable non-transitory memory media). It will be appreciated that one or more portions, or all of the code may be remote from the user and, for example, resident on a network resource, such as a LAN server, Internet server, network storage device, etc. In certain embodiments, the computer system comprises a standard personal computer. The computer system can comprise standard communication components (e.g., keyboard, mouse, trackball, touchpad, toggle switches) for receiving user input (e.g., commands and/or data from a human operator), and can comprise standard communication components (e.g., image display screen, alphanumeric meters, printers) for displaying and/or recording output data, and computer-readable non-transitory memory media (e.g., random-access memory (RAM) integrated circuits; hard-disk drives).

While the foregoing detailed description discloses several embodiments, it should be understood that this disclosure is illustrative only and is not limiting. It should be appreciated that specific configurations and operations in accordance with certain embodiments described herein can differ from the particular example described herein, and that the example apparatus and methods described herein can be used in other contexts. Additionally, components can be added, removed, and/or rearranged. Additionally, processing steps can be added, removed, or reordered. A wide variety of designs and approaches are possible.

Various modifications to the embodiments described herein may be readily apparent to those skilled in the art, and the generic principles defined herein may be applied to other embodiments without departing from the spirit or scope of this disclosure. Thus, the claims are not intended to be limited to the embodiments shown herein, but are to be accorded the widest scope consistent with this disclosure, the principles and the novel features disclosed herein. The word "exemplary" is used exclusively herein to mean "serving as an example, instance, or illustration." Any embodiment described herein as "exemplary" is not necessarily to be construed as preferred or advantageous over other embodiments. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the device as implemented.

Certain features that are described in this specification in the context of separate embodiments also can be implemented in combination in a single embodiment. Conversely, various features that are described in the context of a single embodiment also can be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the embodiments described herein should not be understood as requiring such separation in all embodiments, and it should be understood that the described program components and

What is claimed:

1. A laser comprising:
a waveguide configured to support a vertically confined fundamental optical mode and at least one vertically confined higher order optical mode;
an active region at a first position with respect to the waveguide; and
a grating at a second position with respect to the waveguide, the first position of the active region configured to provide more gain to the at least one higher order mode and the second position of the grating configured to provide more feedback to the fundamental optical mode.

2. The laser of claim 1, wherein the grating overlaps with a peak of the fundamental optical mode.

3. The laser of claim 1, wherein the grating overlaps with a null of the at least one higher order optical mode.

4. The laser of claim 1, wherein an optical power of light outputted from the laser is between about 10 mW and about 50 W.

5. The laser of claim 1, wherein a side mode suppression ratio of light outputted from the laser is between about 10 dB and about 150 dB.

6. The laser of claim 1, wherein the waveguide comprises a first plurality of layers comprising a first material having a first refractive index and a second plurality of layers comprising a second material having a second refractive index.

7. The laser of claim 1, wherein the active region is over the waveguide.

8. The laser of claim 1, wherein the active region is within the waveguide.

9. The laser of claim 1, wherein the grating is within the waveguide.

10. The laser of claim 1, wherein the waveguide is between and vertically confined by a first region and a second region, the first region comprising a first material having a first refractive index, the second region comprising a second material having a second refractive index, the waveguide comprising a third material having a third refractive index, the first refractive index less than the third refractive index, and the second refractive index less than the third refractive index.

11. The laser of claim 10, wherein the waveguide is laterally confined by at least one region comprising a fourth material having a fourth refractive index.

12. The laser of claim 11, wherein the fourth refractive index is substantially equal to the first refractive index and/or the second refractive index.

13. The laser of claim 11, wherein the fourth material is electrically blocking or insulating.

14. A method for designing a laser comprising a waveguide, an active region, and a grating, the method comprising:
providing a position of the active region and a position of the grating;
calculating at least a vertically confined first optical mode and at least one vertically confined second optical mode supported by the waveguide for the position of the active region and the position of the grating;
adjusting the positions of the active region and the grating such that an overlap of the first optical mode with the active region is smaller than the overlap of the second optical mode with the active region, an overlap of the first optical mode with the grating region is larger than the overlap of the second optical mode with the grating, and a first product of an overlap of the first optical mode with the grating and an overlap of the first optical mode with the active region is greater than a second product of an overlap of the at least one second optical mode with the grating and an overlap of the at least one second optical mode with the active region;
re-calculating at least the first optical mode and the at least one second optical mode and determining perturbations of at least the first optical mode and the at least one second optical mode resulting from the adjusted positions of the active region and the grating;
calculating a difference between the first product and the second product;
adjusting, if the difference is less than a threshold value, the positions of the active region and the grating such that the first product is larger than the second product.

15. The method of claim 14, wherein the first optical mode is a vertically confined fundamental optical mode supported by the waveguide and the at least one second optical mode is a vertically confined second order optical mode and/or a vertically confined third order optical mode supported by the waveguide.

16. The method of claim 14, wherein the position of the active region and the position of the grating are within the waveguide.

17. The method of claim 14, wherein the threshold value is 1 dB, 3 dB, 10 dB, 15 dB, 20 dB, or any value in a range/sub-range defined by any of these threshold values.

18. A laser comprising:
a waveguide configured to support a vertically confined fundamental optical mode and at least one vertically confined higher order optical mode;
an active region at a first position with respect to the waveguide;
a grating at a second position with respect to the waveguide, the first position of the active region and the second position of the grating configured to reduce a first lasing threshold for the fundamental optical mode and to increase a second lasing threshold for the at least one higher order optical mode; and
wherein the grating provides more overlap with the fundamental optical mode compared to higher order mode.

19. The laser of claim 18, wherein the active region overlaps with a peak of the fundamental optical mode.

20. The laser of claim 18, wherein the active region overlaps with a null of the at least one higher order optical mode.

21. The laser of claim 18, wherein the grating overlaps with a null of the at least one higher order optical mode.

* * * * *